(12) United States Patent
Matsukizono (10) Patent No.: US 9,343,580 B2
(45) Date of Patent: May 17, 2016

(54) SEMICONDUCTOR DEVICE (71) Applicant: Sharp Kabushiki Kaisha, Osaka-shi, Osaka (JP)

(72) Inventor: Hiroshi Matsukizono, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 45 days.

(21) Appl. No.: 14/362,412

(22) PCT Filed: Dec. 3, 2012

(86) PCT No.: PCT/JP2012/081290
§ 371 (c)(1),
(2) Date: Jun. 3, 2014

(87) PCT Pub. No.: WO2013/084846
PCT Pub. Date: Jun. 13, 2013

(65) Prior Publication Data
US 2014/0346502 A1 Nov. 27, 2014

(30) Foreign Application Priority Data
Dec. 5, 2011 (JP) ................................. 2011-265875

(51) Int. Cl.
*H01L 29/10* (2006.01)
*H01L 29/786* (2006.01)
(Continued)

(52) U.S. Cl.
CPC .......... *H01L 29/7869* (2013.01); *H01L 27/127* (2013.01); *H01L 27/1225* (2013.01); *H01L 29/66969* (2013.01); *G02F 2001/134372* (2013.01)

(58) Field of Classification Search
CPC .............. G02F 1/136227; G02F 2001/134372; G02F 1/133514; G02F 1/134363; G02F 1/1368; G02F 2001/136222; H01L 21/3003; H01L 27/1214; H01L 27/1225; H01L 27/13; H01L 28/10; H01L 26/66969; H01L 29/7869; H01L 2924/0002; H01L 29/4908; H01L 29/78696; H01L 2924/00; H01L 29/66757; H01L 29/78675; H01L 27/3262; H01L 29/66742; H01L 29/786
See application file for complete search history.

(56) References Cited

U.S. PATENT DOCUMENTS

2006/0267138 A1 11/2006 Kobayashi
2008/0024416 A1 1/2008 Onogi et al.
(Continued)

FOREIGN PATENT DOCUMENTS

JP 2001-183685 A 7/2001
JP 2007-013120 A 1/2007
(Continued)

OTHER PUBLICATIONS

Official Communication issued in International Patent Application No. PCT/JP2012/081290, mailed on Feb. 12, 2013.
(Continued)

*Primary Examiner* — Robert Bachner
(74) *Attorney, Agent, or Firm* — Keating & Bennett, LLP (57) ABSTRACT

A semiconductor device (100*a*) with a thin-film transistor (10*a*) includes: a gate electrode (62) formed on a substrate (60); a gate insulating layer (66) formed on the gate electrode; an oxide semiconductor layer (68) formed on the gate insulating layer; source and drain electrodes (70*s*, 70*d*) electrically connected to the oxide semiconductor layer; a protective layer (72) formed on the oxide semiconductor layer and the source and drain electrodes; an oxygen supplying layer (74) formed on the protective layer; an anti-diffusion layer (78) formed on the oxygen supplying layer; and a transparent electrode (81) formed on the anti-diffusion layer and made of an amorphous transparent oxide.

11 Claims, 10 Drawing Sheets (51) Int. Cl.
*H01L 27/12* (2006.01)
*H01L 29/66* (2006.01)
*G02F 1/1343* (2006.01)

(56) References Cited

U.S. PATENT DOCUMENTS

2010/0134710 A1 6/2010 Ishitani et al.
2011/0133179 A1* 6/2011 Yamazaki ........... H01L 21/3003
257/43

FOREIGN PATENT DOCUMENTS

| JP | 2008-032899 A | 2/2008 |
| JP | 2010-156960 A | 7/2010 |
| JP | 2011-142309 A | 7/2011 |
| WO | 2012/086513 A1 | 6/2012 |

OTHER PUBLICATIONS

Moriguchi et al., "Semiconductor Device and Display Device", U.S. Appl. No. 13/996,033, filed Jun. 20, 2013.

* cited by examiner

SEMICONDUCTOR DEVICE

TECHNICAL FIELD

The present invention relates to a semiconductor device including a thin-film transistor and a method for fabricating such a semiconductor device, and also relates to a liquid crystal display device.

BACKGROUND ART

An active-matrix-addressed liquid crystal display device generally includes a substrate on which thin-film transistors (which will also be referred to herein as "TFTs") are provided as switching elements for respective pixels (such a substrate will be referred to herein as a "TFT substrate"), a counter substrate on which a counter electrode, color filters and other members are arranged, a liquid crystal layer which is interposed between the TFT substrate and the counter substrate, and a pair of electrodes to apply a voltage to the liquid crystal layer.

Various modes of operation have been proposed and adopted for active-matrix-addressed liquid crystal display devices according to their intended application. Examples of those modes of operation include a TN (Twisted Nematic) mode, a VA (Vertical Alignment) mode, an IPS (In-Plane-Switching) mode and an FFS (Fringe Field Switching) mode.

Among these modes, the TN and VA modes are longitudinal electric field modes in which a pair of electrodes that face each other with a liquid crystal layer interposed between them apply an electric field to liquid crystal molecules. On the other hand, the IPS and FFS modes are lateral electric field modes in which a pair of electrodes is provided for one substrate to apply an electric field to liquid crystal molecules parallel to the surface of the substrate (i.e., laterally). According to the lateral electric field method, liquid crystal molecules do not rise with respect to the substrate, and therefore, a wider viewing angle can be achieved than in the longitudinal electric field method, which is beneficial.

Among various modes of operation by the lateral electric field method, in an IPS mode liquid crystal display device, a pair of comb electrodes are formed on a TFT substrate by patterning a metal film, and therefore, the transmittance and aperture ratio will decrease, which is a problem. On the other hand, in an FFS mode liquid crystal display device, the electrodes to be formed on the TFT substrate are transparent, and therefore, the aperture ratio and transmittance can be increased.

FFS mode liquid crystal display devices are disclosed in Patent Documents Nos. 1 and 2, for example.

On the TFT substrate of these display devices, a common electrode and a pixel electrode are arranged over each TFT with an insulating film interposed between them. Among these electrodes, a hole is cut as a slit through the electrode which is located closer to the liquid crystal layer (e.g., the pixel electrode). As a result, generated is an electric field which is represented by electric lines of force that are emitted from the pixel electrode, pass through the liquid crystal layer and the slit hole, and then reach the common electrode. This electric field has a lateral component with respect to the liquid crystal layer. Consequently, a lateral electric field can be applied to the liquid crystal layer.

Recently, people have proposed that an oxide semiconductor be used as a material for the active layer of a TFT instead of a silicon semiconductor. Such a TFT will be referred to herein as an "oxide semiconductor TFT". Since an oxide semiconductor has higher mobility than amorphous silicon, the oxide semiconductor TFT can operate at higher speeds than an amorphous silicon TFT. For example, Patent Document No. 1 discloses an active-matrix-addressed liquid crystal display device which uses an oxide semiconductor TFT as a switching element.

In the liquid crystal display device of Patent Document No. 1, a film with the function of attenuating the intensity of visible radiation to transmit is provided as an interlayer film to be arranged to cover the oxide semiconductor layer of each TFT, and is made to serve as a color filter while preventing the electrical characteristic of the TFT from varying. In this manner, the manufacturing cost of the liquid crystal display device can be cut down.

CITATION LIST

Patent Literature

Patent Document No. 1: Japanese Laid-Open Patent Publication No. 2010-156960
Patent Document No. 2: Japanese Laid-Open Patent Publication No. 2008-32899

SUMMARY OF INVENTION

Technical Problem

In an oxide semiconductor TFT, however, during the manufacturing process of TFTs (e.g., during a heat treatment process step), oxygen deficiencies could be caused to raise the carrier concentrating and shift the threshold voltage and the turn-on voltage of drain current in the negative direction, which is a problem. In addition, in a source and drain electrode etching process step or in the process step of forming an insulating layer over the source and drain electrodes, the underlying oxide semiconductor layer could be subject to a reduction action and other kinds of damages, which is also a problem.

The present inventor discovered and confirmed via experiments that in an oxide semiconductor TFT which is configured so that an oxide semiconductor layer contacts with either an underlying gate insulating layer or an overlying protective layer, defect levels are easily produced inside the oxide semiconductor layer or in the vicinity of the interface between the oxide semiconductor layer and the insulating layer or between the oxide semiconductor layer and the protective layer, thus deteriorating the characteristic of the TFTs and causing a decrease in their reliability and some dispersion in quality between individual products (see PCT International Application Publication No. 2012/086513, the entire disclosure of which is hereby incorporated by reference).

In Patent Document No. 1, influence of the diffusion of hydrogen or water which is included in an insulating layer or an organic resin layer during the heat treatment process step on the characteristic of TFTs is not taken into consideration. However, the electrical characteristic of the TFTs should vary due to the diffusion of such water or hydrogen. In addition, in the liquid crystal display device disclosed in Patent Document No. 1, contact portions to electrically connect upper and lower pixel electrodes to their associated lines and electrodes in an FFS mode liquid crystal display device are formed on a pixel by pixel basis. Such a configuration will not contribute to increasing the definition (the number of pixels) effectively.

The present inventor perfected our invention in order to overcome these problems by providing a semiconductor device which can not only reduce those defects to be caused in an oxide semiconductor layer of an oxide semiconductor TFT but also contribute to increasing the definition (the number of pixels) effectively.

Solution to Problem

A semiconductor device according to an embodiment of the present invention is a semiconductor device including a thin-film transistor, and also includes: a gate electrode formed on a substrate; a gate insulating layer formed on the gate electrode; an oxide semiconductor layer formed on the gate insulating layer; source and drain electrodes electrically connected to the oxide semiconductor layer; a protective layer formed on the oxide semiconductor layer and the source and drain electrodes; an oxygen supplying layer formed on the protective layer; an anti-diffusion layer formed on the oxygen supplying layer; and a transparent electrode formed on the anti-diffusion layer, the transparent electrode being made of an amorphous transparent oxide.

In one embodiment, the anti-diffusion layer is another transparent electrode which is made of a crystalline transparent oxide.

In one embodiment, the anti-diffusion layer is formed so as to cover the thin-film transistor with the protective layer and the oxygen supplying layer interposed between them.

In one embodiment, the oxygen supplying layer is made of a material including water ($H_2O$), an OR group, or an OH group.

In one embodiment, the oxygen supplying layer is made of an acrylic resin, an SOG material, a silicone resin, an ester-polymerization resin, or a resin including a silanol group, a CO—OR group or an Si—OH group.

In one embodiment, the oxygen supplying layer has a thickness falling within the range of 500 nm to 3500 nm.

In one embodiment, the anti-diffusion layer has a thickness falling within the range of 50 nm to 500 nm.

In one embodiment, the protective layer is made of silicon oxide or silicon nitride.

In one embodiment, an etch stopper layer is formed so as to cover the channel region of the oxide semiconductor layer.

In one embodiment, the source and drain electrodes is formed under the oxide semiconductor layer.

A liquid crystal display device according to an embodiment of the present invention includes a semiconductor device having the configuration described above. The transparent electrode is a pixel electrode, and that another transparent electrode is a common electrode.

A semiconductor device fabricating method according to an embodiment of the present invention is a method for fabricating a semiconductor device including a thin-film transistor. The method includes the steps of: (A) forming a thin-film transistor on a substrate so that the thin-film transistor includes a gate electrode, a gate insulating layer formed on the gate electrode, an oxide semiconductor layer formed on the gate insulating layer, and source and drain electrodes electrically connected to the oxide semiconductor layer; (B) forming a protective layer on the oxide semiconductor layer and on the source and drain electrodes; (C) forming an oxygen supplying layer on the protective layer; (D) forming an anti-diffusion layer on the oxygen supplying layer; and (E) forming a transparent electrode, including an amorphous transparent oxide, on the anti-diffusion layer. In the step (E), no annealing process is carried out after a film of the amorphous transparent oxide to be the transparent electrode has been deposited.

In one embodiment, the step (D) includes the step of forming another transparent electrode including a crystalline transparent oxide as the anti-diffusion layer.

In one embodiment, the step (D) includes the step of forming the anti-diffusion layer so that the anti-diffusion layer covers the thin-film transistor with the protective layer and the oxygen supplying layer interposed between them.

In one embodiment, the step (A) includes the step of forming an etch stopper layer so that the etch stopper layer covers a portion of the oxide semiconductor layer to be a channel region.

In one embodiment, the step (A) includes the step of forming the oxide semiconductor layer on the source and drain electrodes.

Advantageous Effects of Invention

An embodiment of the present invention provides a semiconductor device which can not only reduce those defects to be caused in an oxide semiconductor layer of an oxide semiconductor TFT but also contribute to increasing the definition (the number of pixels) effectively.

BRIEF DESCRIPTION OF DRAWINGS

[FIG. 1] (a) is a schematic cross-sectional view illustrating a semiconductor device 100a as an embodiment of the present invention, and (b) is a schematic cross-sectional view illustrating a liquid crystal display device 1000 including the semiconductor device 100a.

[FIG. 2] (a) and (b) are graphs showing how the electrical characteristic of a TFT changes depending on whether or not an annealing process is carried out after a conductive film to be a transparent electrode 81 has been deposited.

[FIG. 3] (a) and (b) are graphs showing how the electrical characteristic of a TFT changes depending on whether or not an annealing process is carried out after a conductive film to be a transparent electrode 81 has been deposited.

[FIG. 4] (a) and (b) are graphs showing how the electrical characteristic of a TFT changes depending on whether or not an annealing process is carried out after a conductive film to be a transparent electrode 81 has been deposited.

[FIG. 5] (a) and (b) are graphs showing how the electrical characteristic of an oxide semiconductor TFT 10a is improved with oxygen supplied from an oxygen supplying layer 74.

[FIG. 6] (a) through (f) are schematic cross-sectional views illustrating how to fabricate the semiconductor device 100a.

[FIG. 7] (a) and (b) are schematic cross-sectional views illustrating how to fabricate the semiconductor device 100a.

[FIG. 10] (a) through (i) are schematic cross-sectional views illustrating how to fabricate the semiconductor device 100b.

[FIG. 11] (a) through (e) are schematic cross-sectional views illustrating how to fabricate the semiconductor device 100c.

[FIG. 12] (a) through (c) are schematic cross-sectional views illustrating how to fabricate the semiconductor device 100c.

[FIG. 13] A schematic plan view of the semiconductor device 100a.

[FIG. 14] (a) through (d) are schematic cross-sectional views illustrating contact portions 108.

DESCRIPTION OF EMBODIMENTS

Hereinafter, embodiments of a display device and semiconductor device according to the present invention will be described with reference to the accompanying drawings. It should be noted, however, that the present invention is in no way limited to the illustrative embodiments to be described below. A semiconductor device according to the present invention may be implemented as a TFT substrate on which oxide semiconductor TFTs have been formed but may also be implemented as a TFT substrate for use in various kinds of display devices and electronic devices, for example. In the following description of embodiments, the semiconductor device will be described as a TFT substrate for a display device including an oxide semiconductor TFT as a switching element.

FIG. 1(a) is a schematic cross-sectional view illustrating a semiconductor device (TFT substrate) 100a as an embodiment of the present invention.

As shown in FIG. 1(a), the TFT 10a includes: a gate electrode 62 formed on a substrate 60 such as a glass substrate; a gate insulating layer 66 formed on the substrate 60 so as to cover the gate electrode 62; an oxide semiconductor layer 68 formed on the gate insulating layer 66; source and drain electrodes 70s, 70d formed on the gate insulating layer 66 and the oxide semiconductor layer 68; a protective layer 72 formed on the source and drain electrodes 70s, 70d; an oxygen supplying layer 74 formed on the protective layer 72; an anti-diffusion layer 78 formed on the oxygen supplying layer 74; and a transparent electrode (transparent pixel electrode) 81 formed over the anti-diffusion layer 78 and made of an amorphous transparent oxide such as amorphous ITO (indium tin oxide) or amorphous IZO (indium zinc oxide). In this TFT 10a, a dielectric layer (insulating layer) 79 is formed between the anti-diffusion layer 78 and the transparent electrode 81. The transparent electrode 81 is electrically connected to the drain electrode 70d inside a contact hole which has been cut through the dielectric layer 79, oxygen supplying layer 74 and protective layer 72.

If the transparent electrode 81 is made of an amorphous transparent oxide as in this structure, the transparent electrode 81 can be patterned with good stability and its line width will vary only a little even if no annealing process is carried out after the amorphous transparent oxide layer has been formed. In addition, it is possible to prevent hydrogen included in the dielectric layer 79 from diffusing and affecting the electrical characteristic of the TFT 10a including the oxide semiconductor layer 68.

The present inventor discovered and confirmed via experiments that if the transparent electrode 81 were made of a crystalline transparent oxide (such as a polycrystalline ITO), the annealing process to be carried out to stabilize the pattern after the crystalline transparent oxide film has been deposited would cause hydrogen included in the dielectric layer 79 to diffuse and reach the channel region of the oxide semiconductor layer 68, reduce the oxide semiconductor and increase oxygen defects, thus eventually shifting the threshold voltage of the TFT in the negative direction. However, if the transparent electrode 81 is made of an amorphous transparent oxide as described above, the pattern can be stabilized easily and oxygen defects are less likely to increase in the oxide semiconductor even if no annealing process is carried out after the amorphous transparent oxide film has been deposited. It should be noted that the contact portion to connect the transparent electrode 81 made of an amorphous transparent oxide with high electrical resistance to the drain electrode 70d is suitably formed on a pixel-by-pixel basis.

The anti-diffusion layer 78 may be made of a crystalline transparent oxide such as polycrystalline ITO or polycrystalline IZO. In this embodiment, the anti-diffusion layer 78 functions as a common electrode. In the following description, the anti-diffusion layer 78 will be sometimes referred to herein as "another transparent electrode (or common electrode) 78". As will be described in detail later, if a crystalline transparent oxide layer with low electrical resistance is used as the common electrode 78, the number of contact portions that need to be provided to electrically connect a common line which has been formed out of the same conductive film as the source or gate line to the common electrode 78 can be reduced, and the frame area that does not contribute to the display operation can be narrowed effectively. Furthermore, if a common potential is always applied to the common electrode 78, the common potential can be more uniform in the display area and the display quality can be improved.

The anti-diffusion layer 78 has been formed so as to cover the TFT 10a with the protective layer 72 and the oxygen supplying layer 74 interposed between them. By arranging the anti-diffusion layer 78 in this manner, it is possible to prevent oxygen derived from water, an OH group or an OR group included in the oxygen supplying layer 74 from diffusing and being emitted out of that layer 74 toward the external environment through an annealing process to be carried out after the anti-diffusion layer 78 has been patterned. Instead, the water, OH group or OR group will diffuse toward the oxide semiconductor layer 68 and the oxygen deficiencies in the channel region of the oxide semiconductor layer 68 can be remedied. Consequently, the transistor performance can be improved, the variation in its characteristic can be reduced, and its reliability can be increased.

The gate electrode 62 may have a double-layer structure in which an upper gate electrode of copper (Cu), for example, has been stacked on a lower gate electrode of titanium (Ti), for example. Alternatively, the gate electrode 62 may also have a triple-layer structure consisting of Ti, Al (aluminum) and Ti layers. The gate insulating layer 66 is made of silicon nitride, for example. Alternatively, the gate insulating layer 66 may also be made of silicon oxide. Or the gate insulating layer 66 may also have a double-layer structure consisting of a silicon nitride layer and a silicon oxide layer.

The oxide semiconductor layer 68 is made of an In—Ga—Zn—O (IGZO) based semiconductor. The source electrode 70s and drain electrode 70d formed on the oxide semiconductor layer 68 are obtained by patterning a conductive layer with a triple-layer structure consisting of Ti, Al and Ti layers. Alternatively, the source electrode 70s and drain electrode 70d may also have a double-layer structure consisting of Al and Ti layers, Cu and Ti layers or Cu and Mo (molybdenum) layers. The protective layer 72 is made of either silicon oxide ($SiO_2$) or silicon nitride ($SiN_x$). Some configuration may have no protective layers 72.

The oxygen supplying layer 74 is made of a material including water ($H_2O$), an OR group, or an OH group. In this embodiment, the oxygen supplying layer 74 is formed by spin-coating the substrate with an acrylic resin, for example. The spin on glass (SOG) material may include a silicone resin, silanol (such as tetrahydroxy silane ($Si(OH)_4$)), alkoxy silane and/or siloxane resin. Alternatively, the oxygen supplying layer 74 may also be made of any other resin material such as a silanol group or an Si—OH group. Still alternatively, the oxygen supplying layer 74 may also be made of an ester-polymerization resin or a resin material including a CO—OR group.

The dielectric layer 79 is made of silicon oxide, silicon nitride, or silicon oxynitride. Among other things, silicon nitride and silicon oxynitride will realize high mass productivity. The dielectric layer 79 is an interlevel insulating layer to be arranged between the anti-diffusion layer 78 and the transparent electrode 81.

In this embodiment, the transparent electrode 81 is made of amorphous ITO. In this case, amorphous ITO can be distinguished from polycrystalline ITO by the following method. For example, if ITO is etched when immersed in an acidic etchant including phosphoric acid, nitric acid and acetic acid or in an acidic etchant including oxalic acid, this ITO should be amorphous ITO. On the other hand, if ITO is either not etched at all or etched at a very low rate (e.g., at a rate of 0.2 nm/sec or less), this ITO should be polycrystalline ITO. Slits have been cut through the transparent electrode 81. And the common electrode 78 has been formed over almost the entire surface of the pixels.

Hereinafter, a configuration for a liquid crystal display device that uses the semiconductor device 100a of this embodiment will be described with reference to FIG. 1(b), which is a schematic cross-sectional view illustrating an exemplary liquid crystal display device 1000 according to this embodiment. The liquid crystal display device 1000 is an FFS mode liquid crystal display device.

As shown in FIG. 1(b), this liquid crystal display device 1000 includes a TFT substrate 100a (corresponding to the semiconductor device 100a) and a counter substrate 900 which face each other with a liquid crystal layer 930 interposed between them, two polarizers 910 and 920 which are arranged outside of the TFT substrate 100a and counter substrate 900, respectively, and a backlight unit 940 which emits light for display purposes toward the TFT substrate 100. In the TFT substrate 100a, the transparent electrode 81 has been divided into multiple portions which are provided for respective pixels. A slit (not shown) has been cut through each of those pixels. The anti-diffusion layer (common electrode) 78 is present at least under the slits of the transparent electrode 81 with the dielectric layer 79 interposed between them, and functions as a common electrode.

Although not shown, in the peripheral area of the TFT substrate 100a, arranged are a scan line driver to drive a plurality of scan lines (gate bus lines) and a signal line driver to drive a plurality of signal lines (data bus lines). The scan line driver and the signal line driver are connected to a controller which is arranged outside of the TFT substrate 100a. Under the control by the controller, scan signals to turn ON and OFF the TFTs are supplied from the scan line driver to those scan lines and display signals (i.e., voltages applied to the transparent electrode 81) are supplied from the signal line driver to those signal lines.

The counter substrate 900 includes color filters 950, which include R (red), G (green) and B (blue) filters that are arranged for respective pixels when a display operation is supposed to be conducted in the three primary colors.

This liquid crystal display device 1000 conducts a display operation by inducing alignments of liquid crystal molecules in the liquid crystal layer 930 in response to a potential difference between the anti-diffusion layer 78 that functions as the common electrode of the TFT substrate 100a and the transparent electrode 81 that functions as pixel electrodes.

Next, it will be described with reference to FIGS. 2 through 4 how the electrical characteristic of the TFT changes depending on whether an annealing process is carried out or not after a conductive film has been deposited to form the transparent electrode 81.

FIGS. 2(a), 3(a) and 4(a) are graphs showing the voltage-current (Vg-Id) characteristics of multiple oxide semiconductor TFTs in a situation where no annealing process is carried out after a conductive film to be the transparent electrode 81 has been deposited. On the other hand, FIGS. 2(b), 3(b) and 4(b) are graphs showing the voltage-current characteristics of multiple oxide semiconductor TFTs in a situation where an annealing process is carried out after a conductive film to be the transparent electrode 81 has been deposited. In each of these graphs, the abscissa represents the gate voltage value and the ordinate represents the source-drain current value. In FIGS. 2(a) and 2(b), the channel length L and channel width W of the oxide semiconductor TFT measured 6 μm (L=6 μm) and 5 μm (W=5 μm), respectively. In FIGS. 3(a) and 3(b), the channel length L and channel width W of the oxide semiconductor TFT measured 8 μm (L=8 μm) and 5 μm (W=5 μm), respectively. And in FIGS. 4(a) and 4(b), the channel length L and channel width W of the oxide semiconductor TFT measured 10 μm (L=10 μm) and 5 μm (W=5 μm), respectively.

Figure 2:
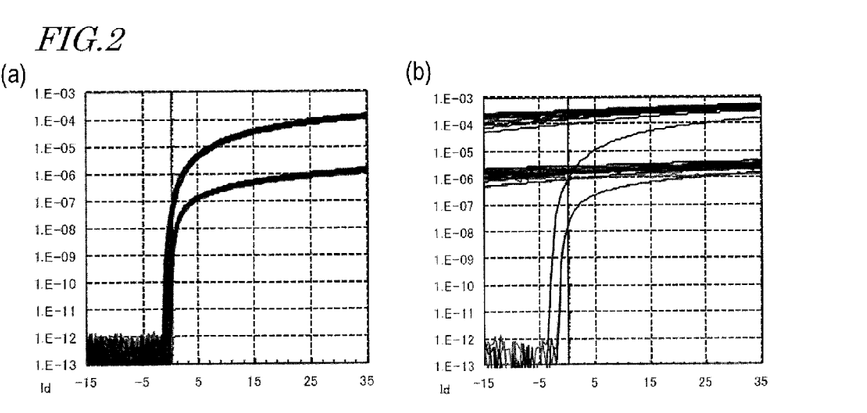
Figure 3:
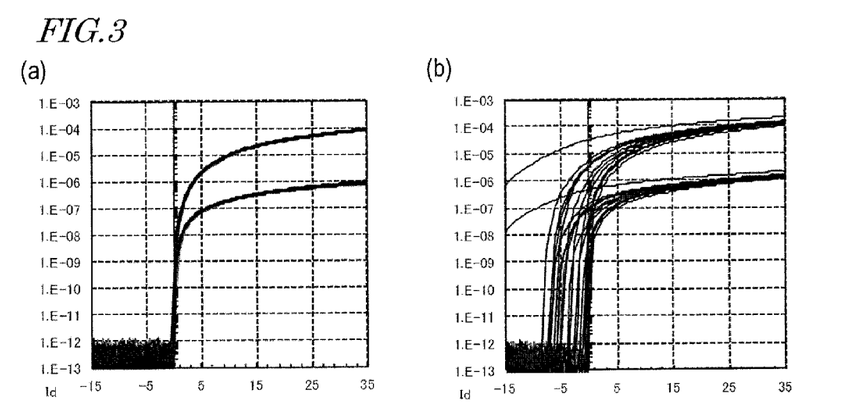
Figure 4:
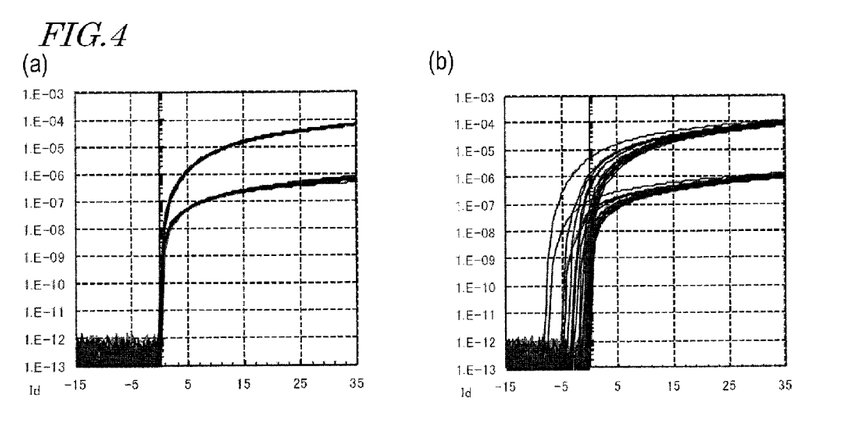

As can be seen from FIGS. 2 to 4, if an annealing process is carried out after a conductive film to be the transparent electrode 81 has been deposited, hydrogen included in the dielectric layer 79 will diffuse and reach the channel region of the oxide semiconductor layer 68, reduce the oxide semiconductor, and increase oxygen defects, thus shifting the turn-on voltage and threshold voltage of the Vg-Id characteristic of the TFT in the negative direction and making the characteristic of the TFT abnormal. In addition, if the source and drain electrodes 70s, 70d include Ti (titanium) or any other metal having the property of adsorbing hydrogen, then hydrogen that has diffused from the dielectric layer 79 will be adsorbed into the source and drain electrodes 70s, 70d and then released into the oxide semiconductor layer 68. That is why the shorter the channel length L of a transistor, the more easily the oxide semiconductor will be reduced over the entire channel region and the more abnormal the TFT characteristic will get. This will be a particularly serious problem when the aperture ratio of each pixel and definition need to be increased as the size of the TFTs is reduced.

Next, it will be described with reference to FIG. 5 how the electrical characteristic of the oxide semiconductor TFT 10a can be improved by being supplied with oxygen from the oxygen supplying layer 74.

FIG. 5(a) is a graph showing the voltage-current (Vg-Id) characteristics of multiple oxide semiconductor TFTs in a situation where no oxygen supplying layer 74 is provided. On the other hand, FIG. 5(b) is a graph showing the voltage-current (Vg-Id) characteristics of multiple oxide semiconductor TFTs in a situation where an annealing process is carried out after an oxygen supplying layer 74 (which is an organic insulating layer in this embodiment) has been formed.

Figure 5:
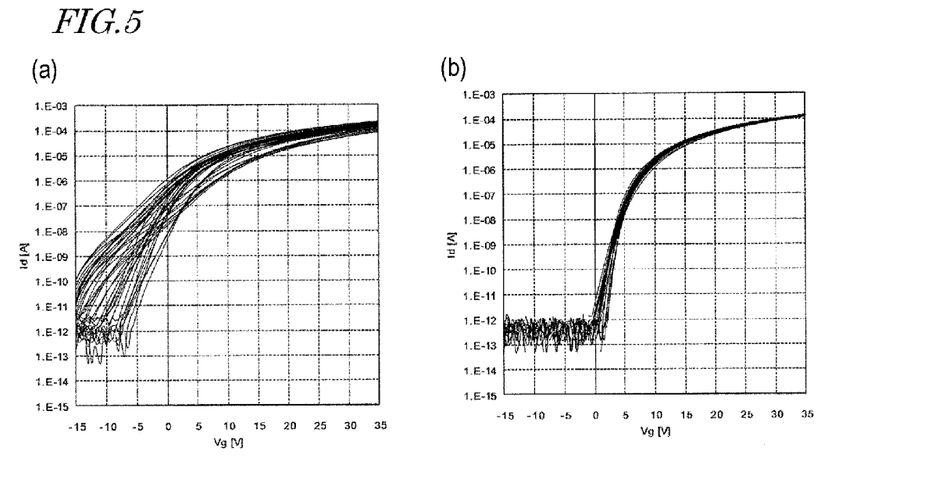

As can be seen from FIG. 5, if an annealing process is carried out after the oxygen supplying layer 74 has been formed, oxygen derived from water, OR group or OH group included in the oxygen supplying layer 74 will diffuse and reach the channel region of the oxide semiconductor layer 68 and repair the oxygen defects, thus improving the Vg-Id characteristic of the oxide semiconductor TFT. That is why the annealing process is suitably carried out in a process step in which oxygen can be diffused efficiently to the channel region of the oxide semiconductor layer 68. In this embodiment, the common electrode 78 functions as an anti-diffusion layer which prevents oxygen from being scattered into the external environment, and therefore, an annealing process is carried out after the common electrode 78 has been formed.

Figure 6:
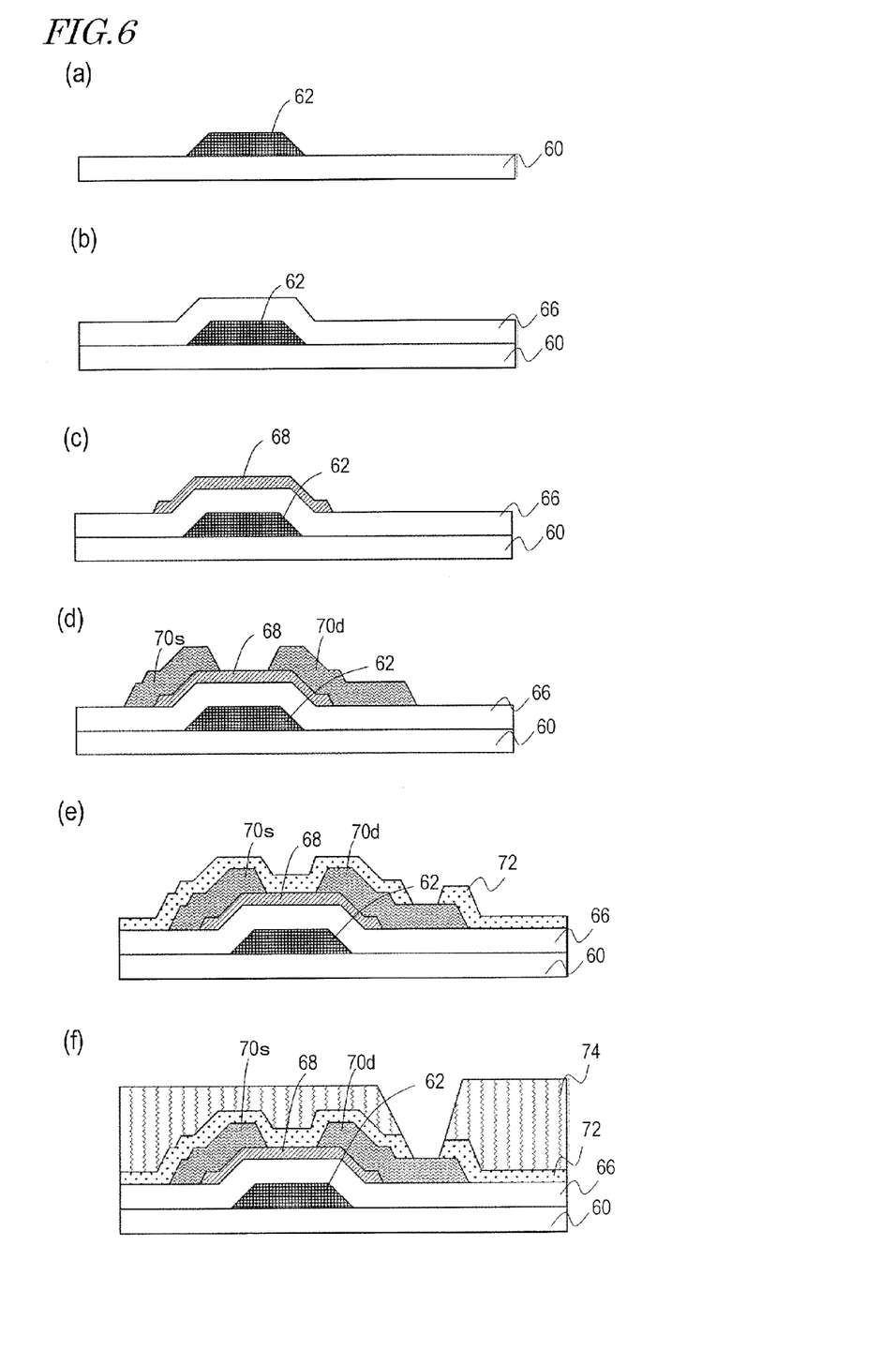
Figure 7:
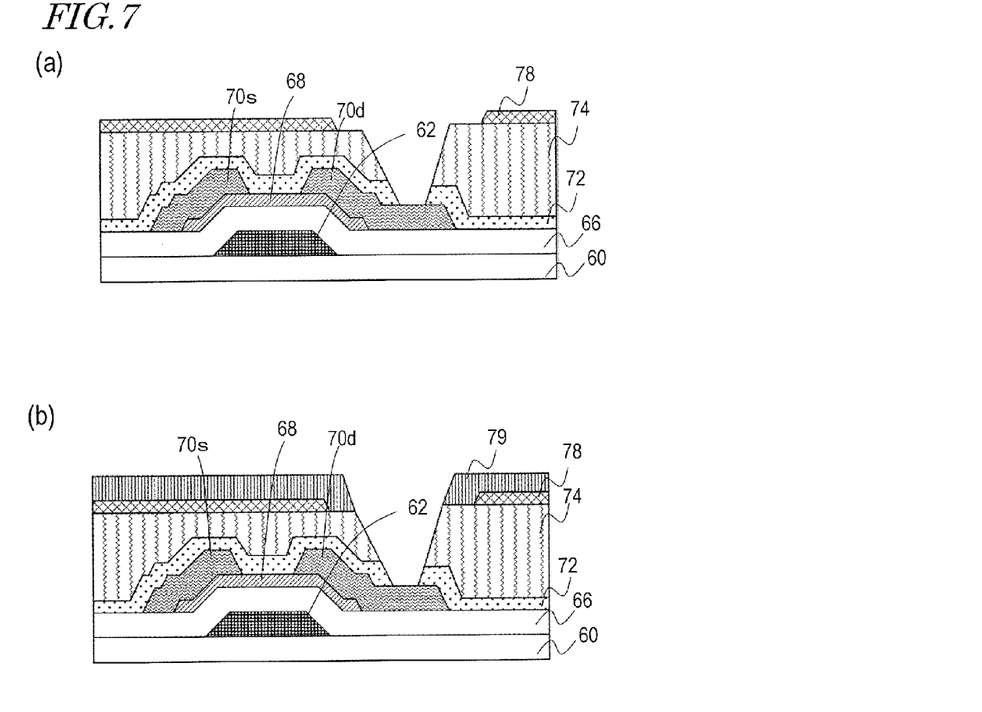

Hereinafter, it will be described with reference to FIGS. 6 and 7 how to make this semiconductor device 100a.

FIGS. 6(a) through 6(f) and FIGS. 7(a) and 7(b) are schematic cross-sectional views illustrating respective manufacturing process steps to fabricate the TFT substrate 100a.

First of all, Ti (titanium), Al (aluminum) and Ti layers are stacked in this order on a substrate 60 by sputtering process, for example. In this case, the Ti layer may be deposited to a thickness of 30 to 150 nm, and the Al layer may be deposited to a thickness of 200 to 500 nm. Next, these three layers stacked are patterned by known photolithography and wet etching techniques, thereby obtaining the gate electrode 62 shown in FIG. 6(a). Although not shown in FIG. 6(a), scan lines, storage capacitor lines, and storage capacitor electrodes are also formed at the same time. After that, the remaining resist pattern is stripped and the substrate 60 is cleaned. The gate electrode 62 may be formed out of a single layer film, a multilayer film or an alloy film of Ti, No (molybdenum), Ta (tantalum), W (tungsten) and/or Cu (copper), for example.

Next, as shown in FIG. 6(b), a gate insulating layer 66 is deposited over the substrate 60 so as to cover the gate electrode 62. The gate insulating layer 66 may be deposited to a thickness of 100 to 700 nm and may consist of a silicon nitride layer and a silicon oxide layer which have been stacked in this order one upon the other by plasma CVD process. Alternatively, the gate insulating layer 66 may also be a single silicon nitride layer or a single silicon oxide layer.

Subsequently, as shown in FIG. 6(c), an oxide semiconductor layer 68 is stacked on the gate insulating layer 66. The oxide semiconductor layer 68 may be an In—Ga—Zn—O (IGZO where In:Ga:Zn=1:1:1) layer, for example, and may be deposited to a thickness of 10 to 100 nm by sputtering process. Alternatively, the oxide semiconductor layer 68 may also be deposited by application or ink jet technique. The oxide semiconductor layer 68 does not have to be an IGZO layer but may also be any other kind of oxide semiconductor film.

Next, a Ti film is deposited by sputtering process over the gate insulating layer 66 to cover the oxide semiconductor layer 68. Subsequently, the Ti film is patterned by photolithographic and wet etching processes, thereby obtaining source and drain electrodes 70s and 70d as shown in FIG. 6(d). After that, the remaining resist pattern is stripped and the substrate is cleaned. Optionally, the wet etching process may be replaced with a dry etching process. The Ti film may be replaced with a single layer film, a multilayer film or an alloy film of Ti, Ta, Cu and/or Mo, for example. In this process step, signal lines, storage capacitor counter electrodes, and other members (none of which are shown) are also formed at the same time.

Next, as shown in FIG. 6(e), silicon oxide is deposited by CVD process all over the substrate 60, thereby forming a protective layer 72. A hole which exposes a portion of the drain electrode 70d is cut through the protective layer 72. Optionally, silicon nitride or silicon oxynitride may be deposited instead of silicon oxide, or silicon oxide and silicon nitride may be stacked one upon the other. The protective layer 72 suitably has a thickness of 25 nm to 350 nm. The reason is as follows. Specifically, if the thickness of the protective layer 72 were less than 25 nm, the layer could not work fine as a protective layer and the reliability of the TFT 10a would decrease. However, if the thickness of the protective layer 72 were greater than 350 nm, then there should be a concern about film peeling due to a film stress. Also, in that case, it would take a lot of time to deposit and etch the protective layer 72, thus resulting in poor productivity. After that, an annealing process is carried out at a temperature of approximately 200 to 400° C. in the air ambient.

Subsequently, as shown in FIG. 6(f), the protective layer 72 is spin-coated with an oxygen supplying layer 74 of an acrylic resin. A hole is cut through the oxygen supplying layer 74 so as to be aligned with the hole of the protective layer 72. Alternatively, the oxygen supplying layer 74 may be formed by spin-coating the protective layer 72 with an SOG material such as a silicone resin, instead of the acrylic resin. As the oxygen supplying layer 74, a layer of silanol, alkoxy silane, or a siloxane resin may be used. Alternatively, the oxygen supplying layer 74 may also be made of any other resin material including a silanol group or an Si—OH group. Still alternatively, the oxygen supplying layer 74 may also be made of an ester-polymerization resin or a resin material including a CO—OR group. The oxygen supplying layer 74 suitably has a thickness of 500 nm to 3500 nm for the following reasons. Specifically, if the thickness of the oxygen supplying layer 74 were less than 500 nm, the effect of improving the electrical characteristic by supplying oxygen could not be achieved sufficiently. However, if the thickness of the oxygen supplying layer 74 were greater than 3500 nm, then there should be a concern about film peeling or a decline in productivity.

Next, as shown in FIG. 7(a), an anti-diffusion layer 78 is formed on the oxygen supplying layer 74. The anti-diffusion layer 78 may be made of either ITO or IZO to function as a common electrode, and is suitably made of polycrystalline ITO or IZO. The anti-diffusion layer 78 is formed so as to cover at least a portion of the oxide semiconductor layer 68 to be a channel region. Also, the anti-diffusion layer 78 has a hole and is formed so that the respective holes of the protective layer 72 and oxygen supplying layer 74 are located inside the hole of the anti-diffusion layer 78. In the process step of patterning the anti-diffusion layer 78, the oxygen supplying layer 74 will absorb water and swell during the wet etching process. That is why an annealing process is carried out at a temperature of approximately 200° C. after the wet etching has been performed. During this annealing process, oxygen is supplied from the oxygen supplying layer 74 to the oxide semiconductor layer 68 to repair the oxygen defects in the oxide semiconductor layer 68. As a result, the dispersion in characteristic between the oxide semiconductor TFTs can be reduced. In this case, the anti-diffusion layer 78 functions as a diffusion blocking layer to prevent oxygen from diffusing. Furthermore, if the anti-diffusion layer 78 is made of polycrystalline ITO, an annealing process is carried out at a temperature of approximately 200° C. to stabilize the line width of the pattern after the ITO film has been deposited. During this annealing process, oxygen is also supplied from the oxygen supplying layer 74 to the oxide semiconductor layer 68 to repair the oxygen defects and reduce the dispersion in characteristic between the oxide semiconductor TFTs. Since polycrystalline ITO or IZO has lower electrical resistance than amorphous ITO or IZO, the number of contact portions to be arranged to input a common potential can be reduced and the width of the frame area that does not contribute to increasing the productivity or conducting a display operation can be decreased.

Next, as shown in FIG. 7(b), a dielectric layer 79 of silicon nitride or silicon oxynitride is deposited by CVD process to a thickness of 100 to 500 nm on the anti-diffusion layer 78 at a substrate temperature of approximately 200° C. or less. If the substrate temperature were higher than 220° C., the oxygen supplying layer 74 could be decomposed to generate gases. However, if the substrate temperature were lower than 170° C., the concentrating of hydrogen in the dielectric layer 79 would be so high that the dispersion in electrical characteristic between the oxide semiconductor TFTs could increase.

Figure 1:
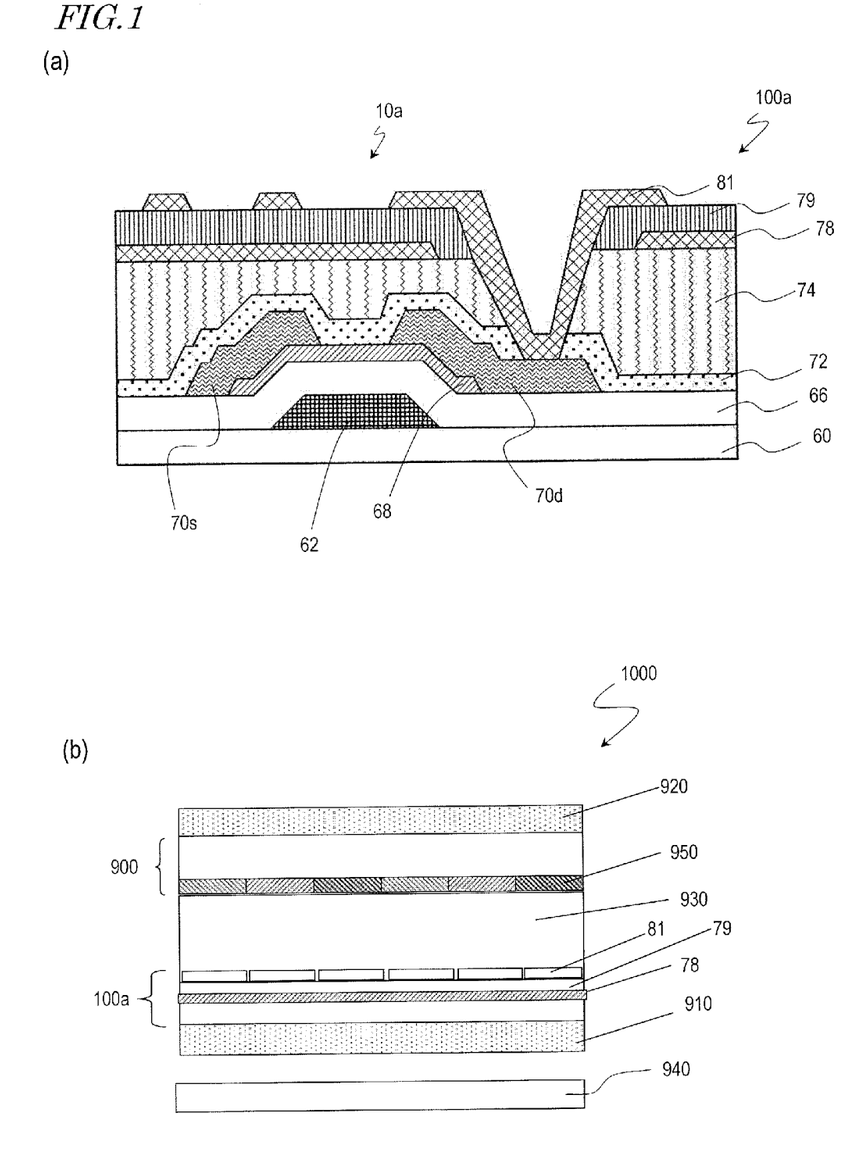

Thereafter, as shown in FIG. 1, a transparent electrode 81 including an amorphous transparent oxide (such as amorphous ITO or IZO) is formed on the dielectric layer 79 by sputtering process. Particularly when ITO is used, the film is deposited with $H_2O$ added to the sputter deposition process gas and at a substrate temperature of 120° C. or less. The transparent electrode 81 is electrically connected to the drain electrode 70d. If the transparent electrode 81 is made of amorphous ITO or IZO, the line width does not vary easily even without performing an annealing process. That is why no annealing process is carried out after an amorphous transparent oxide film has been deposited. As a result, diffusion of hydrogen from the dielectric layer 79, which would be involved with the annealing process, can be avoided, and an increase in carrier concentrating due to the reduction of the oxide semiconductor layer 68 can be checked. Consequently, an oxide semiconductor TFT with good TFT characteristics can be obtained.

By performing these process steps, a semiconductor device 100a including the TFT 10a is completed.

Figure 8:
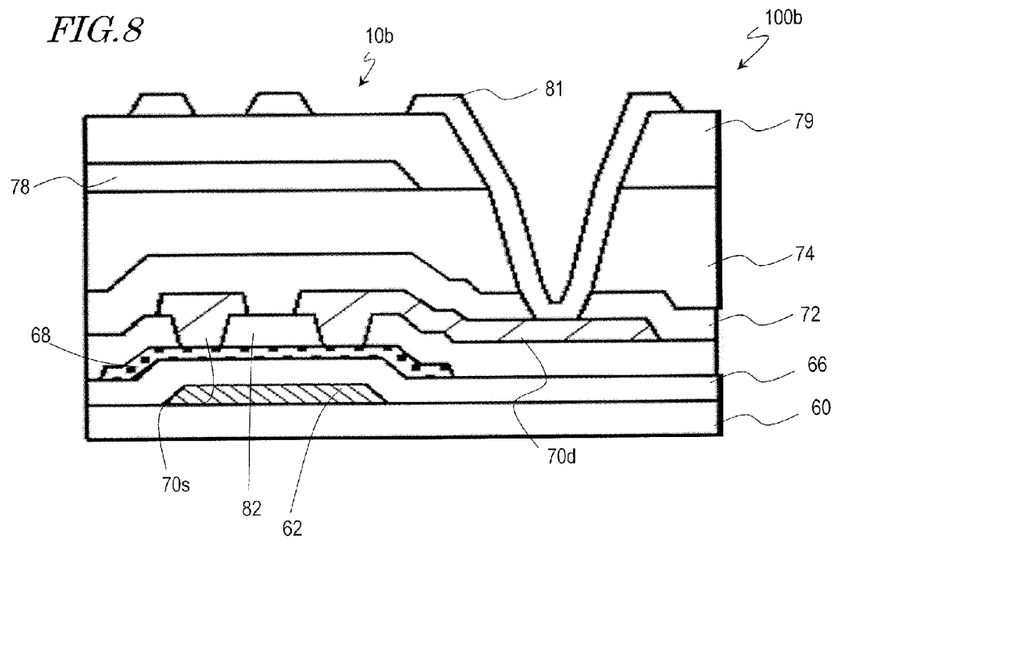
[FIG. 8] A schematic cross-sectional view illustrating a semiconductor device 100b as another embodiment of the present invention.

Hereinafter, a semiconductor device 100b as another embodiment of the present invention will be described with reference to FIG. 8. In FIG. 8, any component also included in the semiconductor device 100a and having substantially the same function as its counterpart is identified by the same reference numeral and description thereof will be omitted herein to avoid redundancies. FIG. 8 is a schematic cross-sectional view of the semiconductor device 100b.

This semiconductor device 100b includes an etch stopper layer 82 which is formed on the oxide semiconductor layer 68 of the TFT 10b so as to cover its channel region, which is a difference from the semiconductor device 100a. On the etch stopper layer 82, located are portions of the source and drain electrodes 70s and 70d. The etch stopper layer 82 may be made of silicon oxide ($SiO_2$) or silicon nitride ($SiN_x$), for example.

Figure 9:
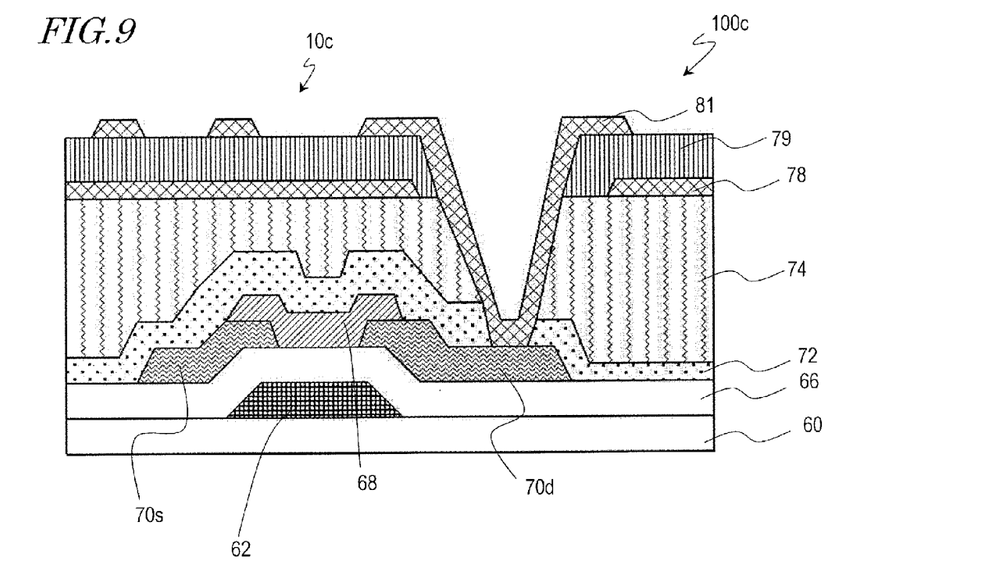
[FIG. 9] A schematic cross-sectional view illustrating a semiconductor device 100c as still another embodiment of the present invention.

Hereinafter, a semiconductor device 100c as still another embodiment of the present invention will be described with reference to FIG. 9. In FIG. 9, any component also included in the semiconductor device 100a and having substantially the same function as its counterpart is identified by the same reference numeral and description thereof will be omitted herein to avoid redundancies. FIG. 9 is a schematic cross-sectional view of the semiconductor device 100c.

In this semiconductor device 100c, the source and drain electrodes 70s and 70d is formed under the oxide semiconductor layer 68 of the TFT 10c, which is a difference from the semiconductor device 100a.

Figure 10:
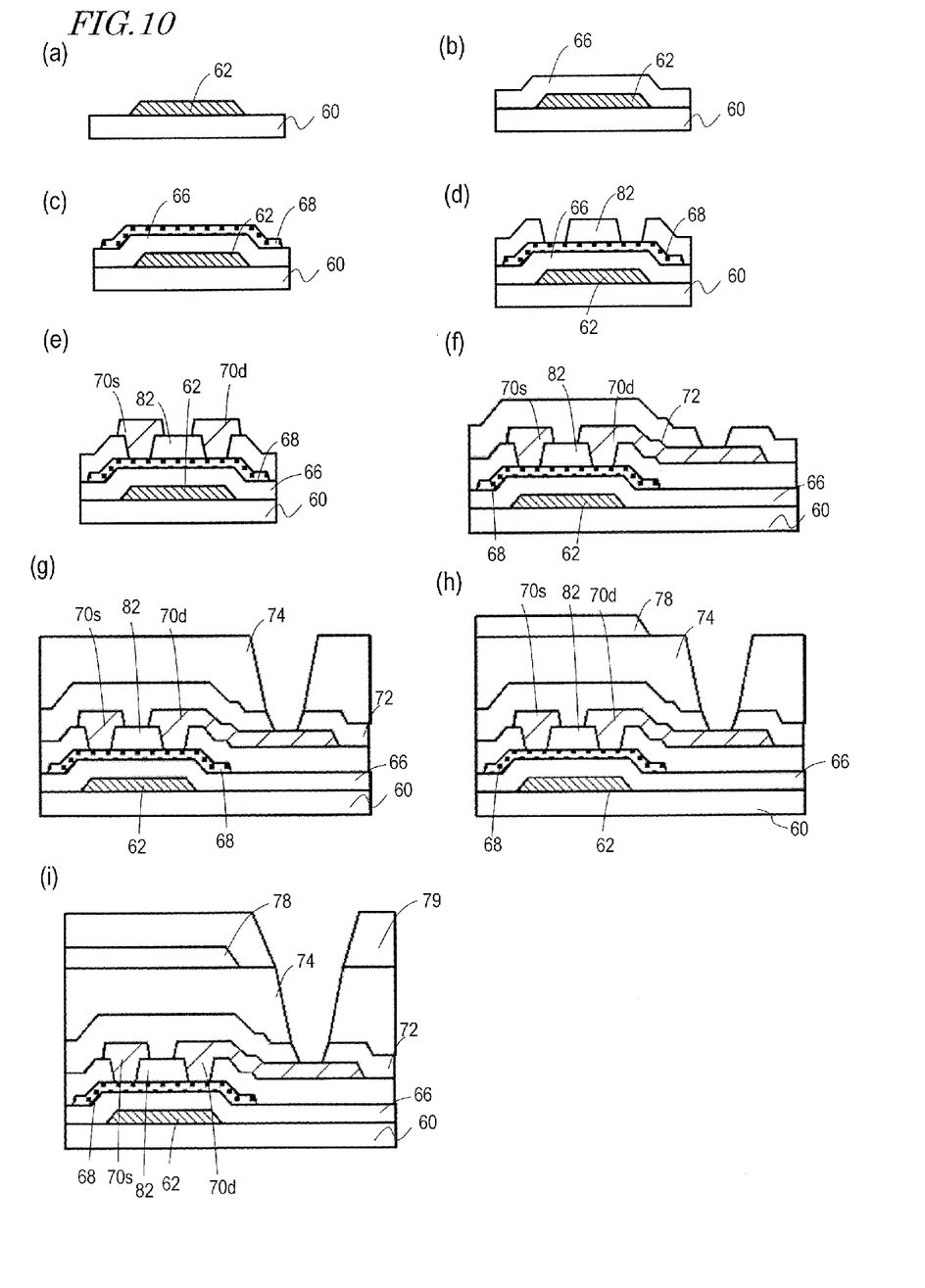
Figure 11:
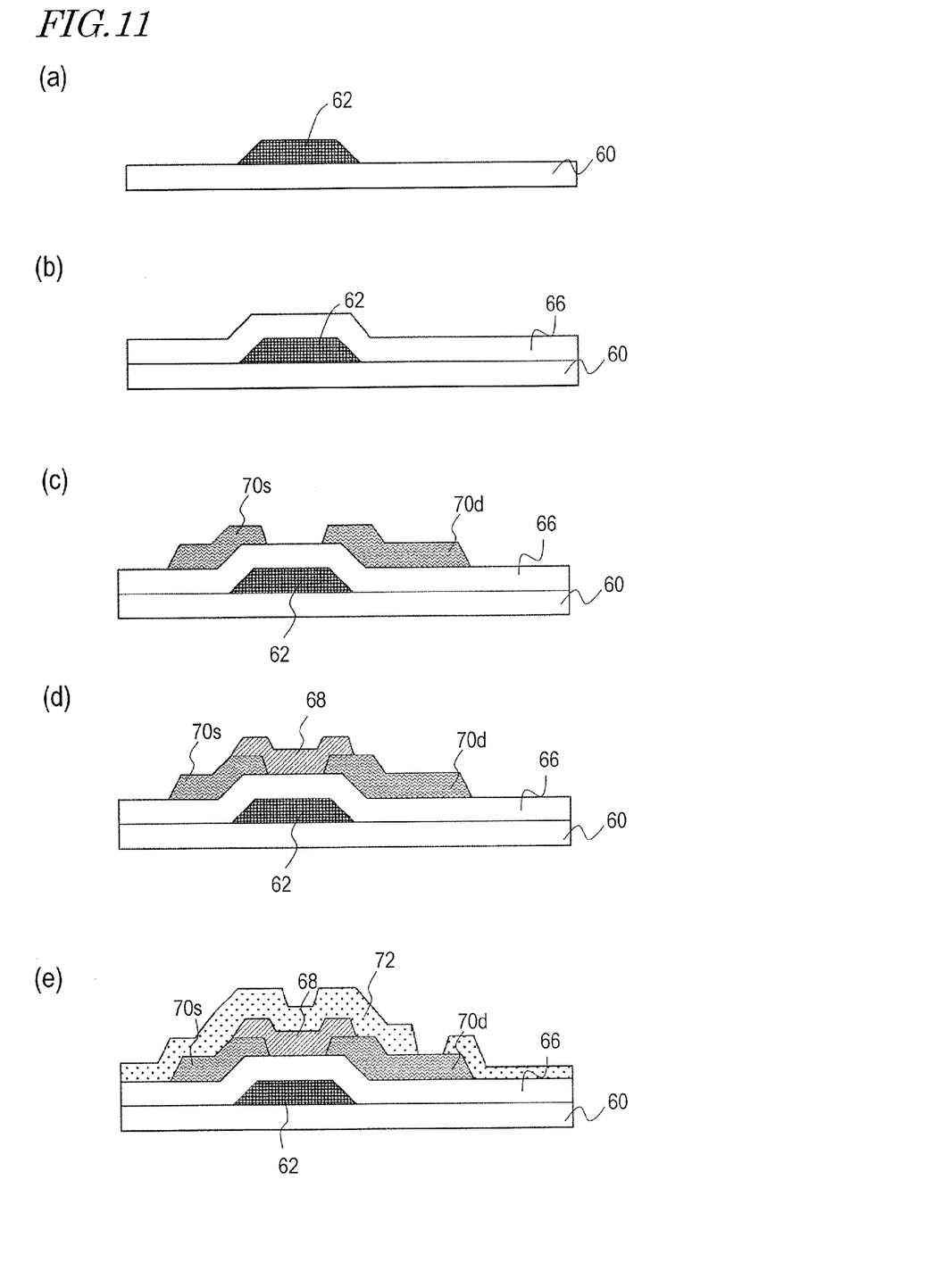
Figure 12:
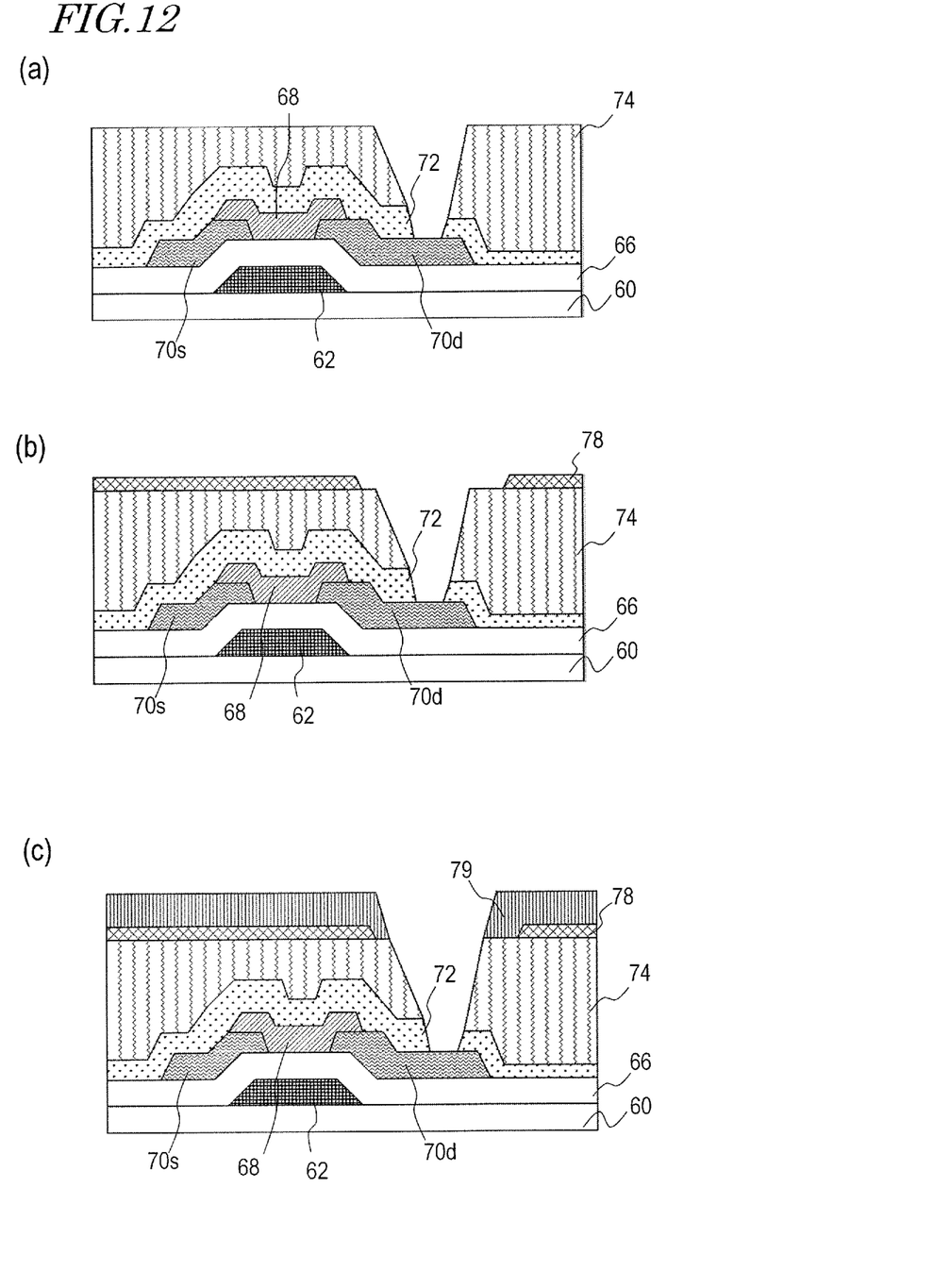

Hereinafter, it will be described with reference to FIG. 10 how to fabricate the semiconductor device 100b. After that, it will be described with reference to FIGS. 11 and 12 how to fabricate the semiconductor device 100c. FIG. 10 illustrates schematic cross-sectional views showing the respective manufacturing process steps to fabricate the semiconductor device 100b. FIGS. 11 and 12 illustrate schematic cross-sectional views showing the respective manufacturing process steps to fabricate the semiconductor device 100c.

First of all, it will be described with reference to FIG. 10 how to fabricate the semiconductor device 100b.

As shown in FIGS. 10(a) to 10(c), a gate electrode 62, a gate insulating layer 66 and an oxide semiconductor layer 68 are formed on a substrate 60 by the method described above.

Next, as shown in FIG. 10(d), an etch stopper layer 82 is formed by CVD process on the oxide semiconductor layer 68. The etch stopper layer 82 is formed so as to cover at least a portion of the oxide semiconductor layer 68 to be a channel region. The etch stopper layer 82 may be made of silicon oxide, for example, but may also be made of silicon nitride or silicon oxynitride. And the etch stopper layer 82 may have a thickness of 50 nm to 300 nm, for example. By providing this etch stopper layer 82, it is possible to prevent an etching process step to be performed later from doing damage on the oxide semiconductor layer 68.

Subsequently, as shown in FIG. 10(e), source and drain electrodes 70s and 70d are formed on the etch stopper layer 82 by the method described above.

Thereafter, as shown in FIGS. 10(f) to 10(i) and FIG. 8, a protective layer 72, an oxygen supplying layer 74, an anti-diffusion layer 78, a dielectric layer 79 and a transparent electrode 81 are formed by the method described above, thereby completing the semiconductor device 100b including the TFT 10b shown in FIG. 8.

Next, it will be described with reference to FIGS. 11 and 12 how to fabricate the semiconductor device 100c.

First, as shown in FIGS. 11(a) and 11(b), a gate electrode 62 and a gate insulating layer 66 are formed on a substrate 60 by the method described above.

Next, as shown in FIG. 11(c), source and drain electrodes 70s and 70d are formed on the gate insulating layer 66 by the method described above.

Subsequently, as shown in FIG. 11(d), an oxide semiconductor layer 68 is formed on the source and drain electrodes 70s and 70d by the method described above. A portion of the oxide semiconductor layer 68 which is located between the source and drain electrodes 70s and 70d and which overlaps with the gate electrode 62 with the gate insulating layer 66 interposed between them will be a channel region.

Then, as shown in FIG. 11(e), a protective layer 72 is formed on the oxide semiconductor layer 68 by the method described above.

Thereafter, as shown in FIGS. 12(a) to 12(c) and FIG. 9, an oxygen supplying layer 74, an anti-diffusion layer 78, a dielectric layer 79 and a transparent electrode 81 are formed by the method described above, thereby completing the semiconductor device 100c including the TFT 10c shown in FIG. 9.

Figure 13:
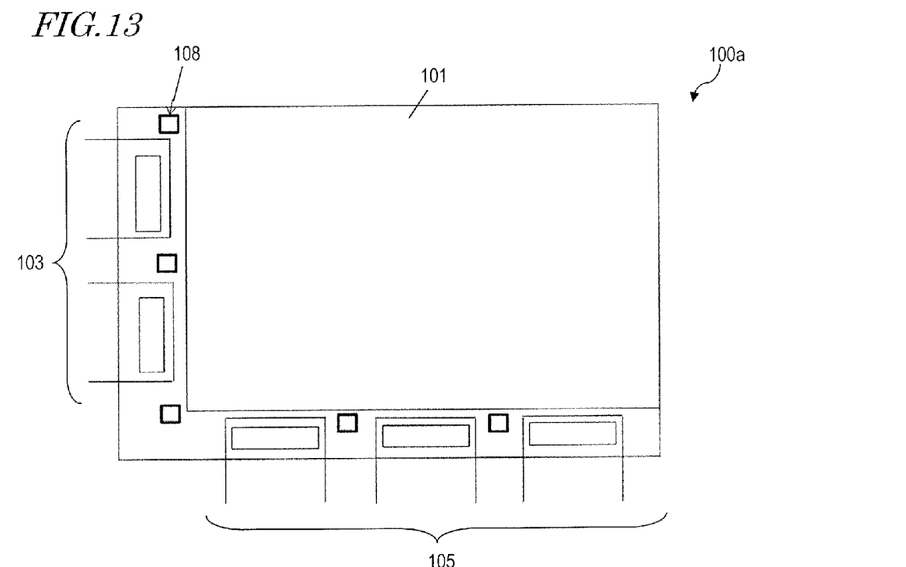

Next, the contact portion 108 to make the common electrode 78 contact with a common line to apply a common potential in an FFS mode liquid crystal display device will be described with reference to FIG. 13, which is a schematic plan view of the semiconductor device 100a.

The semiconductor device 100a has a display area 101 in which TFTs 10a are provided for respective pixels and a frame area which surrounds the display area and which does not contribute to a display operation. In the frame area, arranged are gate input terminals 103, source input terminals 105, and contact portions 108 to make the common electrode 78 contact with a common line (not shown). Those contact portions 108 have been formed in the area where the gate input terminals 103 are arranged and in the area where the source input terminals 105 are arranged. In this semiconductor device 100a, the common electrode 78 is made of a crystalline oxide with low electrical resistance, and therefore, there is no need to provide the contact portion 108 for each pixel and the aperture ratio of each pixel does not decrease unlike the liquid crystal display device disclosed in Patent Document No. 1. In addition, since a lot of contact portions 108 do not have to be formed, the frame area can be narrowed effectively. Furthermore, by carrying out an annealing process to stabilize the width of the patterned lines after a conductive film has been deposited to form the common electrode 78, the oxygen defects in the oxide semiconductor layer can be reduced with oxygen supplied from the oxygen supplying layer 74 at the same time. As a result, the productivity of the semiconductor device 100a can be increased, the dispersion in electrical characteristic between the TFTs 10a decreases, and their reliability increases. The same can be said about the semiconductor devices 100b and 100c described above, too.

Figure 14:
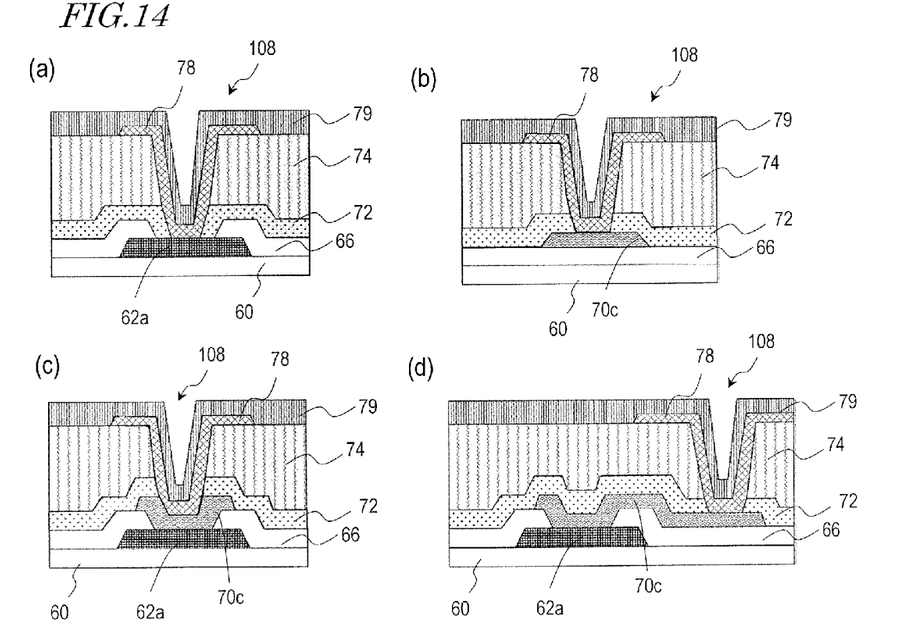

Next, the structures of the contact portions 108 will be described with reference to FIG. 14, which illustrate schematic cross-sectional views of the contact portions 108.

The contact portion 108 shown in FIG. 14(a) includes a gate portion 62a which is formed on a substrate 60 out of the same conductive film as the gate electrode 62 of the TFT 10a, a gate insulating layer 66 formed on the substrate 60, a protective layer 72 formed on the gate insulating layer 66, an oxygen supplying layer 74 formed on the protective layer 72, a common electrode 78 formed on the oxygen supplying layer 74, and a dielectric layer 79 formed on the common electrode 78. The common electrode 78 is electrically connected to the gate portion 62a inside a contact hole which has been cut through the protective layer 72 and the oxygen supplying layer 74. The contact hole that electrically connects the common electrode 78 and the gate portion 62a together is located over the gate portion 62a. The dielectric layer 79 is formed so as to cover the common electrode 78.

The contact portion 108 shown in FIG. 14(b) includes a gate insulating layer 66 formed on a substrate 60, a source portion 70c which is formed on the gate insulating layer 66 out of the same conductive film as the source and/or drain electrode(s) 70s, 70d of the TFT 10a, a protective layer 72 formed on the gate insulating layer 66, an oxygen supplying layer 74 formed on the protective layer 72, a common electrode 78 formed on the oxygen supplying layer 74, and a dielectric layer 79 formed on the common electrode 78. The common electrode 78 is electrically connected to the source portion 70c inside a contact hole which has been cut through the protective layer 72 and the oxygen supplying layer 74. The contact hole that electrically connects the common electrode 78 and the source portion 70c together is located over the source portion 70c. The dielectric layer 79 is formed so as to cover the common electrode 78.

The contact portion 108 shown in FIG. 14(c) includes a gate portion 62a which is formed on a substrate 60 out of the same conductive film as the gate electrode 62 of the TFT 10a, a gate insulating layer 66 formed on the substrate 60, a source portion 70c which is formed on the gate portion 62a out of the same conductive film as the source and/or drain electrode(s) 70s, 70d of the TFT 10a, a protective layer 72 formed on the gate insulating layer 66, an oxygen supplying layer 74 formed on the protective layer 72, a common electrode 78 formed on the oxygen supplying layer 74, and a dielectric layer 79 formed on the common electrode 78. The source portion 70c is electrically connected to the gate portion 62a inside a hole which has been cut through the gate insulating layer 66. The common electrode 78 is electrically connected to the source portion 70c inside a contact hole which has been cut through the protective layer 72 and the oxygen supplying layer 74. The contact hole that electrically connects the common electrode 78 and the source portion 70c together is located over the source portion 70c. The dielectric layer 79 is formed so as to cover the common electrode 78.

The contact portion 108 shown in FIG. 14(d) includes a gate portion 62a which is formed on a substrate 60 out of the same conductive film as the gate electrode 62 of the TFT 10a, a gate insulating layer 66 formed on the substrate 60, a source portion 70c which is formed on the gate portion 62a out of the same conductive film as the source and/or drain electrode(s) 70s, 70d of the TFT 10a, a protective layer 72 formed on the gate insulating layer 66 and the source portion 70c, an oxygen supplying layer 74 formed on the protective layer 72, a common electrode 78 formed on the oxygen supplying layer 74, and a dielectric layer 79 formed on the common electrode 78. The source portion 70c is electrically connected to the gate portion 62a inside a hole which has been cut through the gate insulating layer 66. The common electrode 78 is electrically connected to the source portion 70c inside a contact hole which has been cut through the protective layer 72 and the oxygen supplying layer 74. The contact hole that electrically connects the common electrode 78 and the source portion 70c together is not located over the gate portion 62a. The dielectric layer 79 is formed so as to cover the common electrode 78.

Among those contact portions 108, the ones provided for the area where the gate input terminals 103 are arranged may have the structures shown in FIGS. 14(a), 14(c) and 14(d), and the ones provided for the area where the source input terminals 105 are arranged may have the structures shown in FIGS. 14(b), 14(c) and 14(d).

The semiconductor devices 100a to 100c described above can not only reduce the defects to be caused in the oxide semiconductor layer of an oxide semiconductor TFT but also contribute to increasing the definition (the number of pixels).

INDUSTRIAL APPLICABILITY

Embodiments of the present invention can be used effectively in a semiconductor device including a thin-film transistor and in a liquid crystal display device, an organic EL display device and other kinds of display devices which include thin-film transistors on their TFT substrate.

REFERENCE SIGNS LIST

10a TFT (thin-film transistor)
60 substrate
62 gate electrode
66 gate insulating layer
68 oxide semiconductor layer
70d drain electrode
70s source electrode
72 protective layer
74 oxygen supplying layer
78 anti-diffusion layer
79 dielectric layer
81 transparent electrode
100a TFT substrate (semiconductor device)

The invention claimed is:
1. A semiconductor device including a thin-film transistor, the device comprising:
   a gate electrode formed on a substrate;
   a gate insulating layer formed on the gate electrode;
   an oxide semiconductor layer formed on the gate insulating layer;
   source and drain electrodes electrically connected to the oxide semiconductor layer;
   a protective layer formed on the oxide semiconductor layer and the source and drain electrodes;
   an oxygen supplying layer formed on the protective layer;
   an anti-diffusion layer formed on the oxygen supplying layer; and
   a transparent electrode formed on the anti-diffusion layer, the transparent electrode being made of an amorphous transparent oxide; wherein the anti-diffusion layer is another transparent electrode which is made of a crystalline transparent oxide.

2. The semiconductor device of claim 1, wherein the anti-diffusion layer is formed so as to cover the thin-film transistor with the protective layer and the oxygen supplying layer interposed between them.

3. The semiconductor device of claim 1, wherein the oxygen supplying layer is made of a material including water ($H_2O$), an OR group, or an OH group.

4. The semiconductor device of claim 1, wherein the oxygen supplying layer is made of an acrylic resin, an SOG material, a silicone resin, an ester-polymerization resin, or a resin including a silanol group, a CO—OR group or an Si—OH group.

5. The semiconductor device of claim 1, wherein the oxygen supplying layer has a thickness falling within the range of 500 nm to 3500 nm.

6. The semiconductor device of claim 1, wherein the anti-diffusion layer has a thickness falling within the range of 50 nm to 500 nm.

7. The semiconductor device of claim 1, wherein the protective layer is made of silicon oxide or silicon nitride.

8. The semiconductor device of claim 1, wherein an etch stopper layer is formed so as to cover the channel region of the oxide semiconductor layer.

9. The semiconductor device of claim 1, wherein the source and drain electrodes are formed under the oxide semiconductor layer.

10. A liquid crystal display device including the semiconductor device of claim 1, wherein the transparent electrode is a pixel electrode, and that another transparent electrode is a common electrode.

11. The semiconductor device of claim 1, wherein the oxide semiconductor layer includes an In—Ga—Zn—O based semiconductor.

* * * * *